United States Patent
Shirakawabe et al.

(10) Patent No.: US 6,294,099 B1
(45) Date of Patent: Sep. 25, 2001

(54) METHOD OF PROCESSING CIRCULAR PATTERNING

(75) Inventors: Yoshiharu Shirakawabe; Hiroshi Takahashi; Susumu Ihcihara; Michel Despont, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/197,586

(22) Filed: Nov. 19, 1998

(30) Foreign Application Priority Data

Nov. 20, 1997 (JP) .................................................. 9-320087

(51) Int. Cl.[7] .................................................. B44C 1/22
(52) U.S. Cl. .................. 216/11; 216/41; 216/47; 216/51; 438/735; 438/736; 438/737; 438/745
(58) Field of Search .................. 216/41, 51, 11, 216/47; 438/735, 736, 737, 745

(56) References Cited

U.S. PATENT DOCUMENTS

| 4,496,418 | * | 1/1985 | Ham ...................................... 156/643 |
| 5,317,938 | * | 6/1994 | De Juan, Jr. et al. .............. 76/104.1 |
| 5,494,179 | * | 2/1996 | Hori et al. .............................. 216/11 |
| 5,853,959 | * | 12/1998 | Brand et al. ........................... 216/41 |
| 5,895,582 | * | 4/1999 | Wilson et al. ......................... 216/41 |

* cited by examiner

Primary Examiner—Randy Gulakowski
Assistant Examiner—Anita Alanko
(74) Attorney, Agent, or Firm—Adams & Wilks

(57) ABSTRACT

A method of producing a circular island even if pollution by dirt or dust affects a mask pattern. A circular island is formed by etching silicon oxide film formed on a silicon substrate using a resist mask, and an acute angle portion of unevenness of the pattern outline comprising silicon oxide film is removed so as to obtain a smooth and substantially circular pattern by additional etching using buffered hydrofluoric acid solution (BHF) after removing the resist mask.

14 Claims, 6 Drawing Sheets

METHOD OF PROCESSING CIRCULAR PATTERNING

BACKGROUND OF THE INVENTION

The present invention relates generally to a method of circular patterning, and more particularly to a method of circular patterning which obtains a stable circular pattern or island without being affected by a difference in minute shapes of masks used for etching.

Prior art exposure devices such as mask aligners transfer a mask pattern to a photoresist layer on a substrate by contacting a chrome mask formed on glass (hereinafter referred to as a glass mask or simply a mask) with the substrate. The transferring process is commonly referred to as a photo fabrication process. Because of this, the shape of the mask is transferred to the photoresist layer with high accuracy.

For example, in FIGS. 8 to 10, the prior art etching processes are shown. Each of FIGS. 8A, 9A, and 10A shows a sectional view of the process and each of FIGS. 8B, 9B, and 10B shows a plane view thereof. As shown in FIG. 8A, silicon oxide film ($SiO_2$) 22 is formed on a silicon substrate 20 by thermal oxidation or the like, and a photoresist film is applied thereon.

Next, resist masks 24a shown in FIGS. 9A and 9B are formed on the silicon oxide film 22 by transferring the mask patterns to the photoresist 24 by a photolithography technique using the above-mentioned exposure device such as a mask aligner. Here, circular and rectangle resist masks are formed as resist masks 24a.

In FIG. 10, a desired pattern 22a is obtained by the silicon oxide film 22 using, for example, buffered hydrofluoric acid solution (BHF) or the like using the resist mask as an etching mask.

However, when the configuration of the circumference of the mask pattern itself is uneven and the shape thereof is distorted when comparing it with a plan diagram, the prior art etching process transfers a mask pattern including these problems because the mask pattern is transferred with high accuracy.

It is difficult to repair a defect at an end process in the prior art etching process.

In the above-mentioned mask, a reproduction of an original mask is generally used by producing an original mask by drawing on the mask after transformation of a coordinate system shape drawn by CAD or the like. Because of this, although high accuracy of transformation of the coordinate system is achievable for overcoming unevenness of the configuration of the circumference portion and the distorted shape of the above-mentioned mask pattern, transformation of the coordinate system can not entirely repair the defect and a high cost for the mask becomes inevitable.

As a defect in the mask pattern appears more often in a curved line pattern such as a circle than in a linear pattern such as a rectangle, a method of forming an accurate circular pattern is required.

Moreover, a defect in pattern shape sometimes appears due to a cause other than the mask shape, for example, because of dirt and dust infiltration during the fabrication process.

The present invention was made with regard to above-mentioned drawbacks of the prior art. An object of the present invention is to provide a method of processing a circular pattern enabling a desired circular pattern to be obtained even if there is pollution caused by dirt and/or dust or a defect in the mask pattern.

SUMMARY OF THE INVENTION

To achieve the above-mentioned object, a first aspect of the invention is characterized by obtaining a circular pattern comprising the steps of forming a circular etching mask on a semiconductor substrate, performing a first etching step to form a circular shape by etching the substrate, removing the etching mask after the first etching step, and performing a second etching step by isotropically etching the pattern obtained by the first etching step, wherein a circular pattern is obtained by etching an acute angle portion of an outline of the pattern obtained in the first etching step in the second etching step.

According to the invention, by removing a mask for etching after a first etching process and performing isotropic etching of the pattern at a second etching process, a smooth circular pattern can be obtained because an acute angle part is etched in the second etching process even if there is the acute angle portion at the circumference of the pattern obtained at the first etching process.

A second aspect of the present invention is characterized by the fact that the second etching process is divided into a plurality of etching processes in the method of forming a circular pattern according to the first aspect.

According to the invention, the second etching process can etch gradually plural times while confirming accuracy of dimension and state of repair of the acute angle portion without limiting etching times.

A third aspect of the present invention is characterized in that the thickness of the etched material and the diameter of the etching mask are set so that the thickness and diameter of the pattern obtained after the second etching process become the desired values in the method of processing of the first or the second aspects.

According to the invention, the pattern obtained finally become the desired dimensions if the thickness of the etched material and the diameter of the mask are determined in consideration of shrinkage because the pattern shape shrinks when the pattern is etched at the second etching process.

10B is a plane view thereof.

DETAILED DESCRIPTION OF THE PREFERRED EMBODIMENTS

Referring to the attached figures, various embodiments of a method of processing a circular pattern according to the present invention will be described.

FIGS. 1 to 5 are process charts illustrating a method of forming a circular pattern in various embodiments according to the present invention. Each of FIGS. 1A to 5A is a sectional view, and each of FIGS. 1B to 6B is a plane view. FIGS. 6A and 6B and FIGS. 7A and 7B are views for describing a principle of the present invention. After the principle is described with reference to FIGS. 6A and 6B and FIGS. 7A and 7B, the process will be described with reference to FIGS. 1A and 1B to 5A and 5B.

Figure 6A:
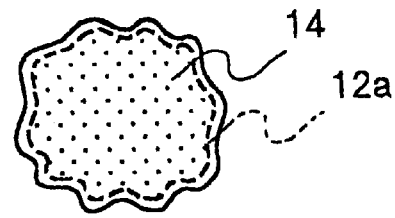
FIG. 6A is a plane view showing the two-step etching principle of the embodiment of the present invention.
Figure 6B:
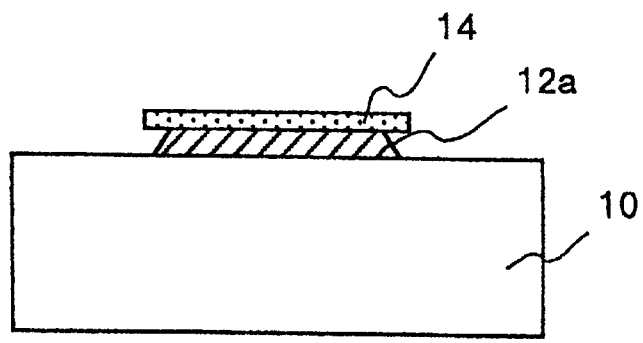
FIG. 6B is a sectional view thereof.

FIG. 6A shows the shape of a resist mask 14 formed by transferring a circular mask pattern to a photoresist layer by a photolithography technique using a photo mask aligner of an exposure device. The photoresist mask 14 is a mask which is used in the etching of silicon oxide film (SiO$_2$) formed on a silicon substrate 10 as shown in FIG. 6B.

Buffered hydrofluoric acid solution (BHF) is used as an etchant of the silicon oxide film so as to obtain a pattern 12a by which the mask shape thereof is transferred accurately. If there is unevenness at the circumference portion of the pattern of the resist mask which is circular originally, the transferred pattern 12a (shown with a broken line) also has a similar unevenness, as shown in FIG. 6A.

Figure 7A:
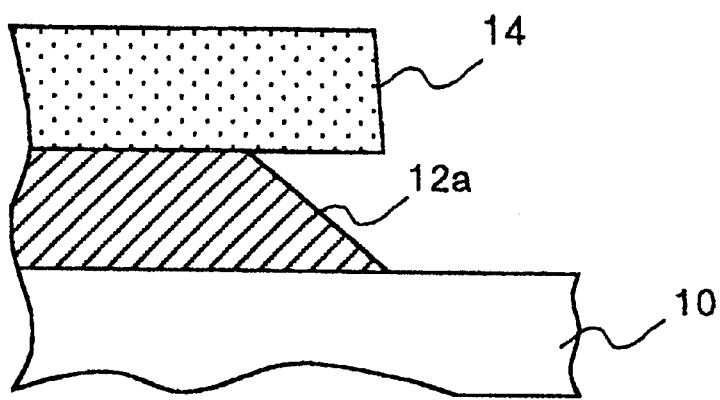
FIGS. 7A to 7C are sectional views showing the two-step etching principle of the embodiment of the present invention.
Figure 7B:
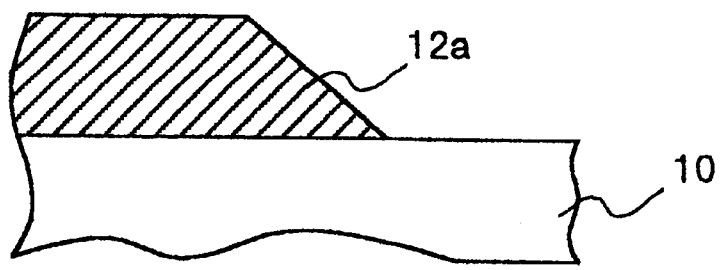
Figure 7C:
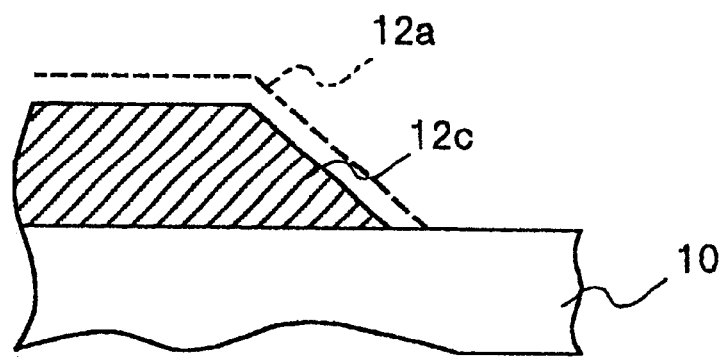
Figure 8A:
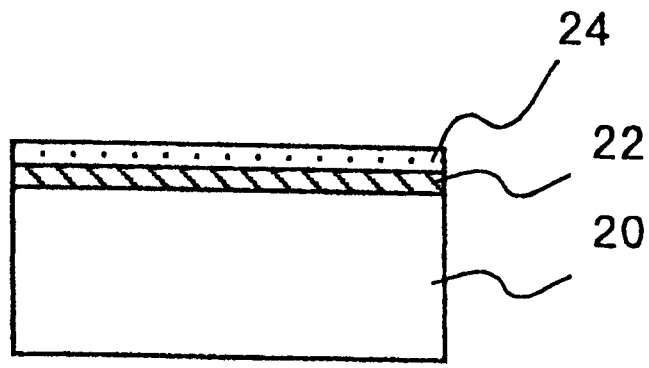
FIG. 8A is a sectional view showing the prior method of forming a circular pattern.
Figure 8B:
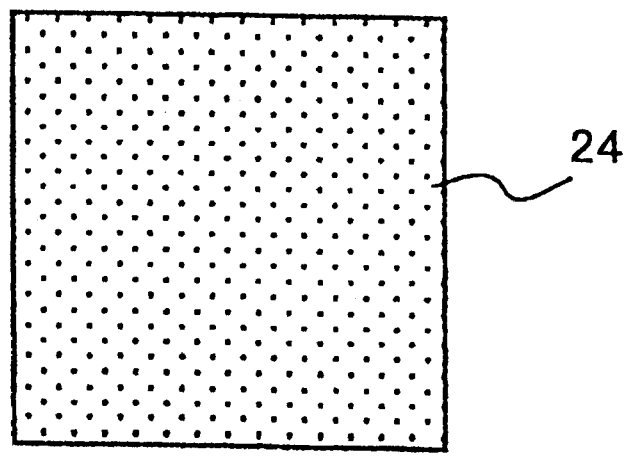
FIG. 8B is a plane view thereof.
Figure 9A:
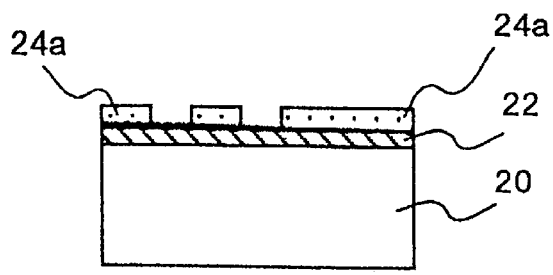
FIG. 9A is a sectional view showing the prior method of forming a circular pattern.
Figure 9B:
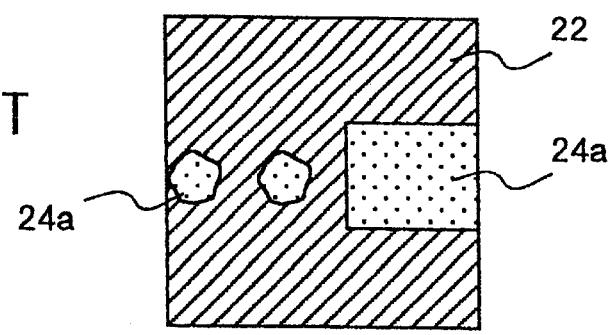
FIG. 9B is a plane view thereof.
Figure 10A:
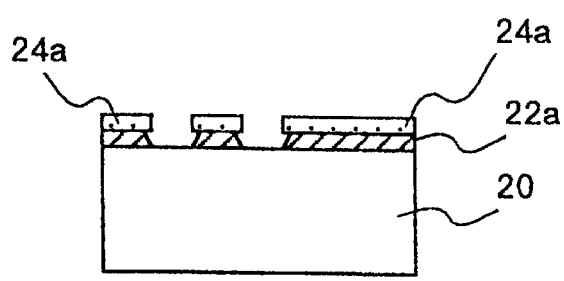
FIG. 10A is a sectional view showing the prior method of forming a circular pattern, and FIG.
Figure 10B:
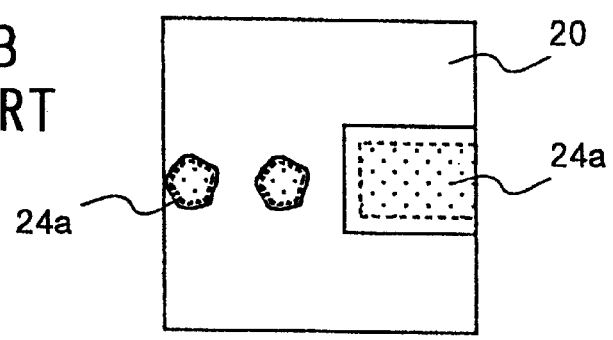

Because of this, a circular pattern 12a having unevenness at the circumference portion is formed after removing the resist mask 14. Therefore, the pattern 12 comprising the etched silicon oxide film after removing the resist mask 14 from the state of FIG. 7A, which is an enlargement of a portion of FIG. 6A, is isotropically etched using a buffer hydrofluoric acid solution (BHF) and the like (FIG. 7B). After that, by shaving of the uneven acute angle portion or the like, circumference portion is etched so that it become smooth, and becomes a shrunk pattern 12c so as to obtain a substantially circular pattern having a circular top surface, a circular sidewall and a circular peripheral edge joining the top surface and the sidewall.

Figure 1:
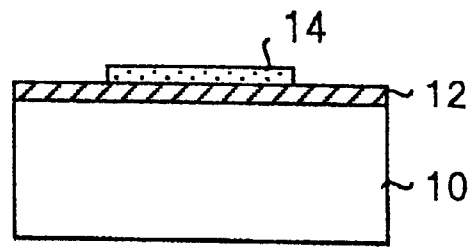
FIG. 1A is a sectional view of a photoresist pattern formed on an insulating layer provided on a substrate, showing a method of forming a circular pattern according to an embodiment of the present invention.
FIG. 1B is a plane view thereof.
Figure 1:
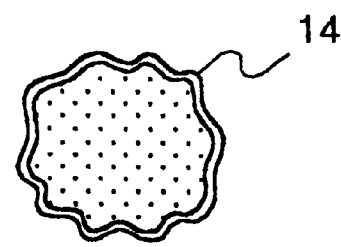

Next, referring to FIGS. 1A and 1B to 5A and 5B, a process according to a preferred embodiment of the present invention will be described. In FIGS. 1A and 1B, a silicon oxide film (SiO$_2$) 12 having a predetermined thickness is formed on a silicon substrate 10 by thermal oxidation and the like. Applying photoresist on the silicon oxide film, a resist mask 14 is formed by a pattern of a glass mask (here a circular pattern) transferred by a photo-process using a mask aligner.

The outline of the resist mask 14 of FIG. 1B is drawn with a double line to show the tapered state of the side of the resist mask 14. The film is also shown in FIG. 2.

Figure 2:
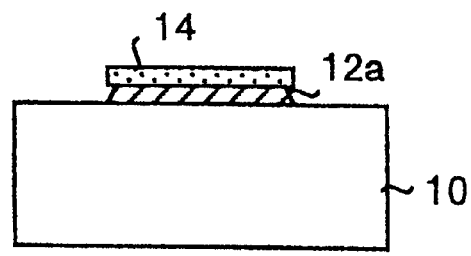
FIG. 2A is a sectional view the etching of the insulating film formed on the substrate in the method of forming a circular pattern according to the embodiment of the present invention.
FIG. 2B is a plane view thereof.
Figure 2:
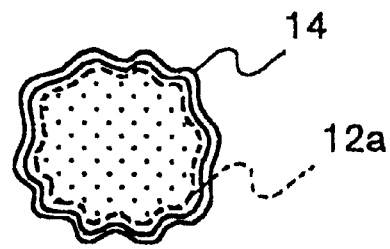

In FIG. 2, since a resist mask 14 comprising an uneven circular pattern obtained in the above-mentioned photo-process is transferred to silicon oxide film 12, wet etching is performed to cure this defect. As the etchant for the wet etching, buffer hydrofluoric acid solution (1:6 BHF) containing one part hydrofluoric acid (50% solution) and six parts ammonium fluoride solution (40% solution) is used here at the normal temperature.

The mixing ratio of the etchant solution is not necessarily limited to the above-mentioned example. For etching with various etching speeds, the mixing ratio may be changed. For example, etching speed of silicon oxide film at a normal temperature using the above-mentioned buffer hydrofluoric acid solution (1:6 BHF) is substantially 1000 angstrom/min.

Figure 3A:
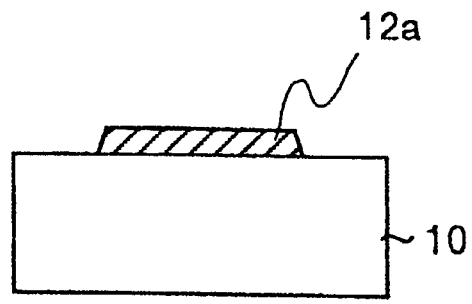
FIG. 3A is a sectional view showing the etched insulating film with the photoresist removed in the method of forming the circular pattern according to the embodiment of the present invention.
Figure 3B:
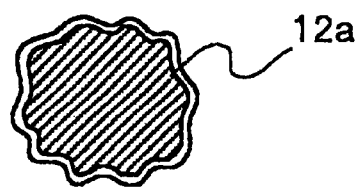
FIG. 3B is a plane view thereof.
Figure 4A:
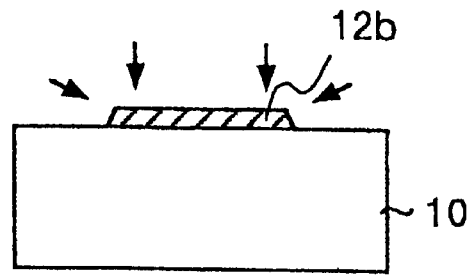
FIG. 4A is a sectional view showing further etching of the insulating film in the method of forming a circular pattern according to the embodiment of the present invention.
Figure 4B:
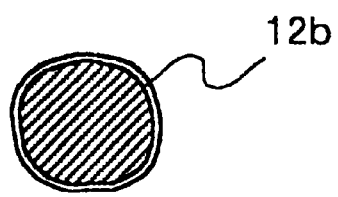
FIG. 4B is a plane view thereof.
Figure 5A:
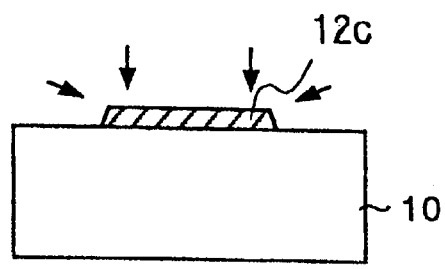
FIG. 5A is a sectional view showing further etching of the insulating film in the method of forming a circular pattern according to the embodiment of the present invention.
Figure 5B:
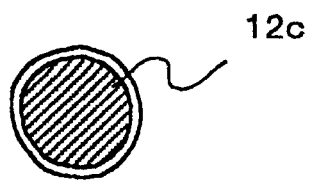
FIG. 5B is a plane view thereof.

Next, FIG. 3 shows the resist mask 14 of FIG. 2 removed by acetone or RAS (98% nitric acid). The pattern 12a of the silicon oxide film remaining is normally used as a mask for processing. In the present embodiment, an acute angle portion of unevenness of the outline portion is gradually etched like the pattern 12b shown FIG. 4 or the pattern 12c shown in FIG. 5 so as to obtain a substantially circular pattern by further etching of the pattern 12a with the same etching condition as in the case of FIG. 2 using buffered hydrofluoric acid solution (BHF).

It was proven by experiment by the present inventors that a substantially circular pattern such as that of the present embodiment can not be obtained by the progress of etching in the horizontal direction even if additional etching is processed with the resist mask using buffered hydrofluoric acid solution (BHF) in the prior art.

Although use of a mask for etching a silicon oxide film (SiO$_2$) was described in the above embodiment, the present invention is not limited to such a mask. It is possible to be applied similarly to a mask for a process other than a silicon oxide film, and in that case, only the buffered hydrofluoric acid solution (BHF) being an etchant of the silicon oxide film need be changed to an etchant corresponding to the type of film.

According to the present invention, a desired circular pattern can be obtained even if there is pollution caused by dirt or dust or a defect in a mask pattern.

What is claimed is:

1. A method of producing a circular island formed from an insulating layer disposed on a semiconductor substrate, comprising the steps of:

forming a circular etching mask on the insulating layer of the semiconductor substrate;

a first etching step for etching the insulating layer to form an island having a circular shape by etching the insulating layer in areas not covered by the etching mask;

removing the etching mask after performing the first etching step; and a second etching step for isotropically etching the circular island obtained in the first etching step so as to form a circular top surface, a circular sidewall and a circular peripheral edge joining the top surface and the sidewall to correct for deviations in the circularity of the etching mask.

2. A method of producing a circular island according to claim 1; wherein the second etching step is divided into a plurality of etching steps.

3. A method of producing a circular island according to claim 1 or claim 2; wherein a thickness of the pattern of the substrate and a diameter of the etching mask are set so that a thickness and a diameter of the circular island obtained after the second etching step have desired values.

4. A method of producing a circular island according to claim 2; wherein the plurality of etching steps each comprise isotropically etching the circular island produced in the first etching process and checking to determine whether the circular island has a desired shape.

5. A method of producing a circular island according to claim 1; wherein the second etching step comprises isotropically etching an acute angle portion at an outline of the island to correct for unwanted deviations in the circularity of the etching mask.

6. A method of producing a circular island according to claim 1; wherein the substrate comprises a semiconductor substrate.

7. A method of producing a circular island according to claim 1; wherein the first and second etching steps are performed using a buffered hydrofluoric acid solution.

8. A method of producing an island having a curved shape on a semiconductor substrate comprising the steps of:

forming an etching mask having a curved shape on the semiconductor substrate;

a first etching step for etching the semiconductor substrate to form an island having the curved shape by etching the semiconductor substrate in areas not covered by the etching mask, the island having an acute angle portion at an outline thereof;

removing the etching mask after performing the first etching step; and a second etching step for isotropically etching the island so as to etch the acute angle portion at the outline of the island to correct for unwanted deviations from the desired curved shape.

9. A method of producing an island having a curved shape according to claim 7; wherein the curved shape comprises a circle.

10. A method of producing an island having a curved shape according to claim 8; wherein a thickness of the pattern of the substrate and a diameter of the etching mask are set so that a thickness and a diameter of the island obtained after the second etching step have desired values.

11. A method of producing an island having a curved shape according to claim 8; wherein the semiconductor substrate has an insulating layer formed thereon, and the circular island is formed from the insulating layer.

12. A method of producing an island having a curved shape according to claim 8; wherein the first and second etching steps are performed using a buffered hydrofluoric acid solution.

13. A method of producing an island having a curved shape according to claim 8; wherein the second etching step is divided into a plurality of etching steps.

14. A method of producing an island having a curved shape according to claim 13; wherein the plurality of etching steps each comprise isotropically etching the island produced in the first etching process and checking to determine whether the island has a desired shape.

\* \* \* \* \*